(12) United States Patent
Hill et al.

(10) Patent No.: US 7,577,534 B2
(45) Date of Patent: Aug. 18, 2009

(54) RISK ASSESSMENT OF METAL VAPOR ARCING

(75) Inventors: Monika C. Hill, League City, TX (US); Henning W. Leidecker, College Park, MD (US)

(73) Assignee: The Boeing Company, Chicago, IL (US)

( * ) Notice: Subject to any disclaimer, the term of this patent is extended or adjusted under 35 U.S.C. 154(b) by 18 days.

(21) Appl. No.: 11/751,195

(22) Filed: May 21, 2007
(Under 37 CFR 1.47)

(65) Prior Publication Data
US 2008/0294357 A1    Nov. 27, 2008

(51) Int. Cl.
*H01H 33/36* (2006.01)
*G06F 19/00* (2006.01)
*H02H 9/04* (2006.01)

(52) U.S. Cl. .................. 702/57; 73/865.8; 73/865.9; 340/635; 340/653; 340/660; 340/662; 361/2; 361/88; 361/91.1; 702/64; 702/182; 702/189

(58) Field of Classification Search ............... 73/432.1, 73/865.8, 865.9; 340/500, 540, 635, 653, 340/660, 661, 662, 679; 361/1, 2, 88, 91.1; 702/1, 33, 34, 57, 64, 127, 182, 187, 189
See application file for complete search history.

(56) References Cited

U.S. PATENT DOCUMENTS

| | | | |
|---|---|---|---|
| 5,047,724 A * | 9/1991 | Boksiner et al. | 324/520 |
| 5,166,624 A * | 11/1992 | Abernathy | 324/452 |
| 6,625,550 B1 * | 9/2003 | Scott et al. | 702/58 |
| 6,839,208 B2 * | 1/2005 | Macbeth et al. | 361/42 |
| 7,068,480 B2 * | 6/2006 | Wong et al. | 361/42 |
| 7,069,116 B2 * | 6/2006 | Kunsman et al. | 700/293 |
| 7,136,265 B2 * | 11/2006 | Wong et al. | 361/42 |
| 2003/0072113 A1 * | 4/2003 | Wong et al. | 361/5 |
| 2004/0042137 A1 * | 3/2004 | Wong et al. | 361/42 |
| 2005/0171647 A1 * | 8/2005 | Kunsman et al. | 700/293 |
| 2006/0291109 A1 * | 12/2006 | Wang | 361/5 |

\* cited by examiner

*Primary Examiner*—Edward R Cosimano
(74) *Attorney, Agent, or Firm*—Klein, O'Neill & Singh, LLP (57) ABSTRACT

A method for assessing metal vapor arcing risk for a component is provided. The method comprises acquiring a current variable value associated with an operation of the component; comparing the current variable value with a threshold value for the variable; evaluating compared variable data to determine the metal vapor arcing risk in the component; and generating a risk assessment status for the component.

22 Claims, 5 Drawing Sheets

RISK ASSESSMENT OF METAL VAPOR ARCING

STATEMENT REGARDING FEDERALLY SPONSORED RESEARCH AND DEVELOPMENT

The disclosure described herein was made in the performance of work under NASA Contract No. NAS9-20000 and is subject to the provisions of Section 305 of the National Aeronautics and Space Act of 1958 (72 Stat.435: 42U.S.C.2457). The government has certain rights in the invention.

FIELD OF THE DISCLOSURE

This disclosure relates generally to a method and system for assessing risk of metal vapor arcing.

BACKGROUND

Spacecrafts use plural devices for operating and monitoring various spacecraft systems. To facilitate both scheduled and unscheduled maintenance, most spacecraft systems are made up of components that can be removed and replaced as a unit. These components are referred to as Line Replaceable Units (LRUs). An LRU may be mechanical, such as a valve or pump; electrical, such as a switch or relay; or electronic, such as an autopilot or an inertial reference computer.

Some LRU's (also referred to as components throughout the disclosure) are electroplated using metals like tin. Metal plated components are at risk for developing metal whiskers. Under certain electrical or atmospheric conditions these metal whiskers may vaporize into plasma. The plasma may form an arc capable of carrying high current in a circuit. Formation of an arc is termed arcing or metal vapor arcing (may also be referred to as "MVA"). MVA may damage a LRU and may cause failure of other components attached to the damaged LRU. Hence, it is desirable to know the risk associated with metal vapor arcing.

Although the MVA problem is illustrated with respect to spacecraft systems, similar problems may exist in other systems (for example, ships, space shuttle, aircrafts, automobiles and others) where LRUs are used. The term spacecraft as used in this disclosure includes the aforementioned systems.

Conventional systems use invasive and inefficient processes to determine MVA risks. Therefore, there is a need for an efficient method and system for assessing MVA risk in a system.

SUMMARY

In one aspect, a method for assessing metal vapor arcing risk for a component is provided. The method comprises acquiring a current variable value associated with an operation of the component; comparing the current variable value with a threshold value for the variable; evaluating compared variable data to determine the metal vapor arcing risk in the component; and generating a risk assessment status for the component.

In yet another aspect, a method for assessing metal vapor arcing risk for a component is provided. The method comprises determining if the component is under high operating pressure or low operating pressure; determining if a fuse-cutoff current is beyond a threshold value for the component, if the component is under low pressure; and labeling the component as being at low risk for metal vapor arcing, if the fuse-cut off current is below the threshold value.

This brief summary has been provided so that the nature of the disclosure may be understood quickly. A more complete understanding of the disclosure may be obtained by reference to the following detailed description of the preferred embodiments thereof in connection with the attached drawings.

BRIEF DESCRIPTION OF THE DRAWINGS

The foregoing features and other features of the present disclosure will now be described with reference to the drawings of a preferred embodiment. The illustrated embodiment is intended to illustrate, but not to limit the disclosure. The drawings include the following.

DETAILED DESCRIPTION

In one embodiment, the present disclosure provides a method and system for assessing metal vapor arcing risk. The system may be implemented in software, hardware and a combination thereof using a computing system.

Figure 1A:
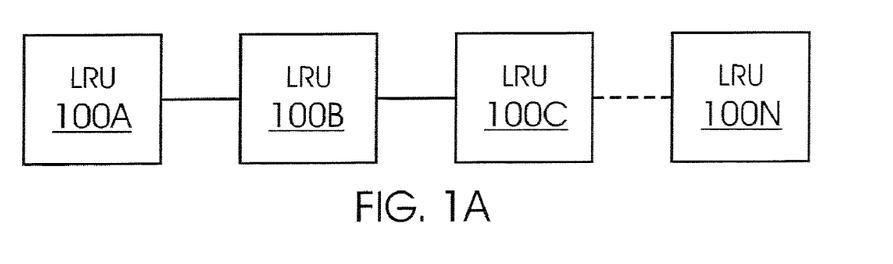
FIG. 1A shows a system with a plurality of line replaceable units (LRUs) interfacing with each other.

FIG. 1A shows a system 100 having plurality of LRUs (100A, 100B . . . 100N) interfacing with each other. An LRU (for example, 100A) with metal electroplating may be prone to metal vapor arcing.

To facilitate an understanding of the adaptive aspects of the disclosure, the general architecture and operation of a computing system will be described first. The specific method will then be described with reference to general architecture.

Figure 1B:
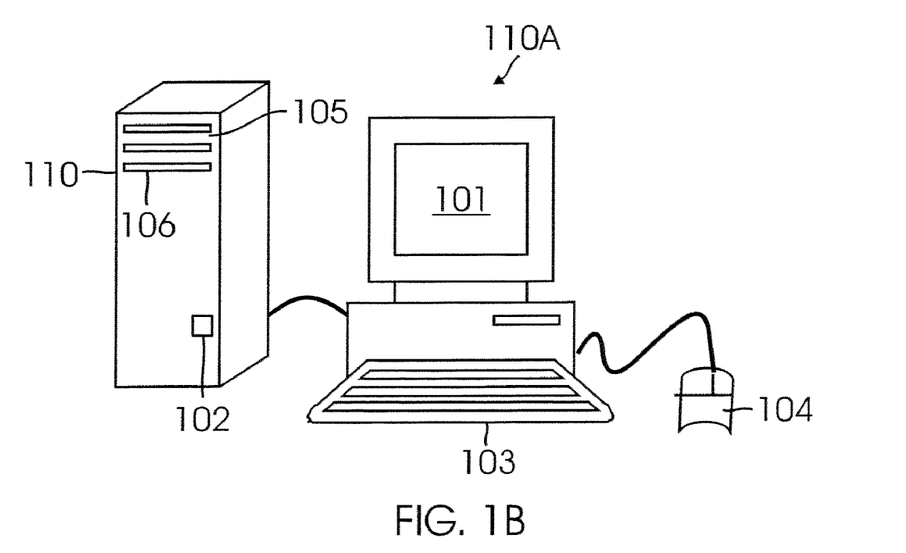
FIG. 1B shows a block diagram of a computing system for executing process steps, according to an embodiment.

Computing System:

FIG. 1B is a block diagram of a computing system 110A for executing computer executable process steps according to one aspect of the present disclosure. Computing system 110A includes a host computer 110 and a monitor 101. Monitor 101 may be a CRT type, a LCD type, or any other type of color or monochrome display.

Also provided with computer 110 are a keyboard 103 for entering data and user commands, and a pointing device (for example, a mouse) 104 for processing objects displayed on monitor 101.

Computer 110 includes a computer-readable memory storage device 105 for storing readable data. Besides other programs, storage device 105 can store application programs including computer executable code, according to an embodiment of the present disclosure.

According to one aspect of the present disclosure, computer 110 can also access computer-readable removable storage device storing data files, application program files, and computer executable process steps embodying the present disclosure or the like via a removable memory device 106 (for example, a CD-ROM, CD-R/W, flash memory device, zip drives, floppy drives and others).

A modem, an integrated services digital network (ISDN) connection, or the like also provide computer 110 with a network connection 102 to the World Wide Web (WWW), to an intranet (the network of computers within a company or entity within the company), or to a spacecraft. The network connection 102 allows computer 110 to download data files, application program files and computer-executable process steps embodying the present disclosure.

It is noteworthy that the present disclosure is not limited to the FIG. 1B architecture. For example, notebook or laptop computers, or any other system capable of connecting to a network and running computer-executable process steps, as described below, may be used to implement the various aspects of the present disclosure.

Figure 1C:
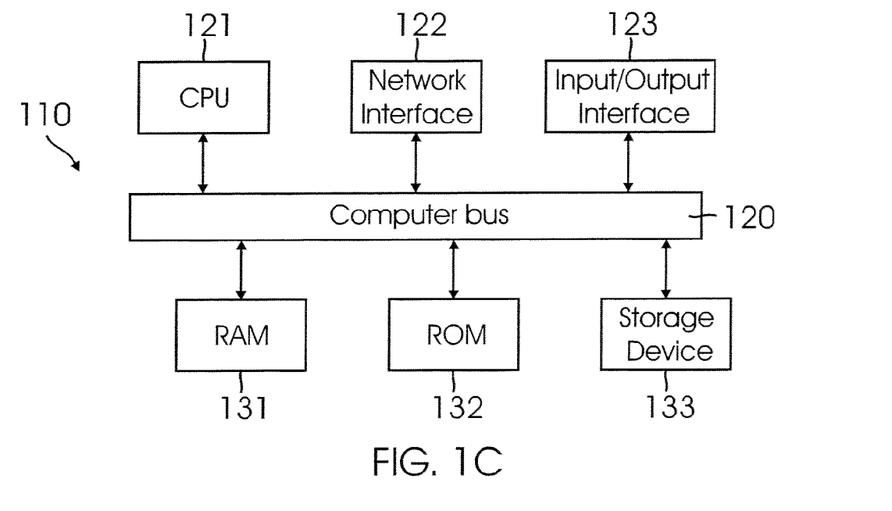
FIG. 1C shows the internal architecture of the computing system of FIG. 1B.

FIG. 1C shows a top-level block diagram showing the internal functional architecture of computer 110 that may be used to execute the computer-executable process steps, according to one aspect of the present disclosure. As shown in FIG. 1C, computer 110 includes a central processing unit (CPU) 121 for executing computer-executable process steps and interfaces with a computer bus 120.

Also shown in FIG. 1C are an input/output interface 123 that operatively connects output display device such as monitors 101, input devices such as keyboards 103 and a pointing device such as a mouse 104.

Computer 110 also includes a storage device 133 (similar to device 105). Storage device 133 may be disks, tapes, drums, integrated circuits, or the like, operative to hold data by any means, including magnetically, electrically, optically, and the like. Storage device 133 stores operating system program files, application program files, computer-executable process steps of the present disclosure and other files. Some of these files are stored on storage device 133 using an installation program. For example, CPU 121 executes computer-executable process steps of an installation program so that CPU 121 can properly execute the application program.

Random access memory ("RAM") 131 also interfaces with computer bus 120 to provide CPU 121 with access to memory storage. When executing stored computer-executable process steps from storage device 133, CPU 121 stores and executes the process steps out of RAM 131.

Read only memory ("ROM") 132 is provided to store invariant instruction sequences such as start-up instruction sequences or basic input/output operating system (BIOS) sequences.

The computer 110 may be connected to other computing systems via network interface 122 using computer bus 120 and a network connection (for example 102). The network interface 122 may be adapted to one or more of a wide variety of networks, including local area networks, storage area networks, wide area networks, the Internet, and the like.

In one aspect of the disclosure, metal vapor arcing risk assessment software (referred to as "risk assessment software") may be supplied on a CD-ROM or a floppy disk or alternatively could be read from the network system via network interface 122. In yet another aspect, the computer 110 can load the risk assessment software from other computer readable media such as magnetic tape, a ROM, integrated circuit, or a magneto-optical disk. Alternatively, the risk assessment software is installed onto storage device 133 of the computer 110 using an installation program and is executed using the CPU 121.

In yet another aspect, the risk assessment software may be implemented by using an Application Specific Integrated Circuit that interfaces with computer 110.

Figure 2:
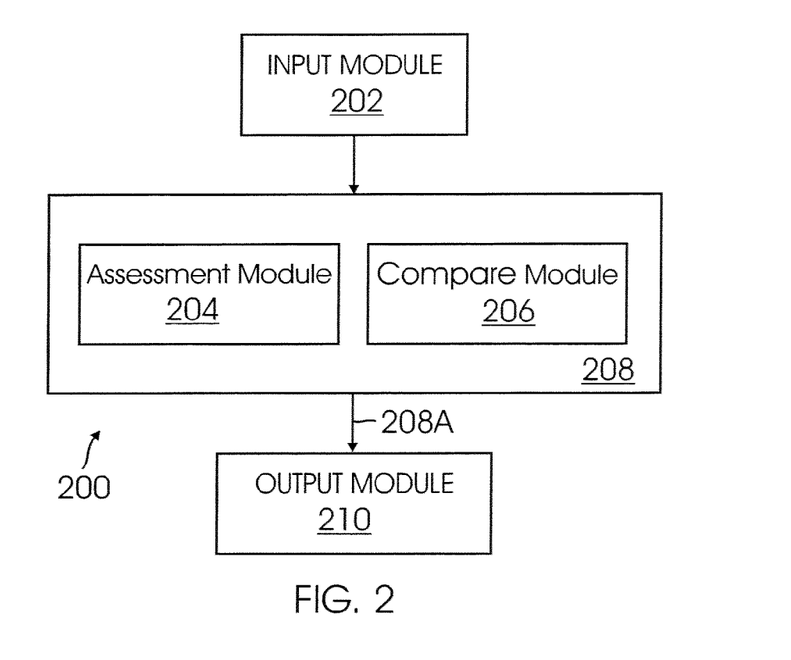
FIG. 2 is a system for assessing the risk of metal vapor arcing for a LRU.

MVA Risk Assessment System:

FIG. 2 shows a block diagram of a system 200 for assessing risk of metal vapor arcing risk for an LRU. System 200 may be implemented in software, hardware or a combination thereof. System 200 comprises an input module 202 interfacing with an analysis module 208; and an output module 210 communicating with analysis module 208.

Input module 202 provides threshold values for variables under which an LRU has minimal (or negligible) metal vapor arcing risk. These variables may include input voltage to the LRU, operating pressure of the LRU, LRU's power supply wattage, inductive voltage of the LRU, fuse cut-off current of the LRU or other parameters. The threshold values may vary with design and overall LRU functionality.

Analysis module 208 is coupled to input module 202. Analysis module 208 includes an assessment module 204 and a compare module 206. Assessment module 204 assesses current (actual) variables for a LRU and compare module 206 compares current variables with the threshold data from input module 202. After the comparison, output module 210 is updated with risk assessment information 208A for the LRU. Risk assessment information 208A may include information that LRU has low risk of MVA, LRU's comparison data requires documentation and further analysis, or rationale for accepting the risk. Risk assessment information 208A may also be used to determine if the LRU may or may not be used as a part of system 100.

It is noteworthy that the foregoing modular structure of system 200 is simply to illustrate the adaptive aspects of the present disclosure. The various modules can be integrated into a single piece of code, subdivided into further sub-modules or implemented in an ASIC. System 200 may be implemented in a computing system similar to computer 110.

Process Steps

Metal vapor arcing is effected by variations in variables like temperature, pressure, current and similar other variables. In one embodiment, a method for assessing metal vapor arcing risk is provided. The method includes determining a current value for plural variables; comparing the current values with threshold values; and determining metal vapor arcing risk for an LRU based on the comparison. The method is non-invasive, i.e., LRU hardware is not opened to assess if any metal whiskers have been formed leading to risk of metal vapor arcing.

Figure 3:
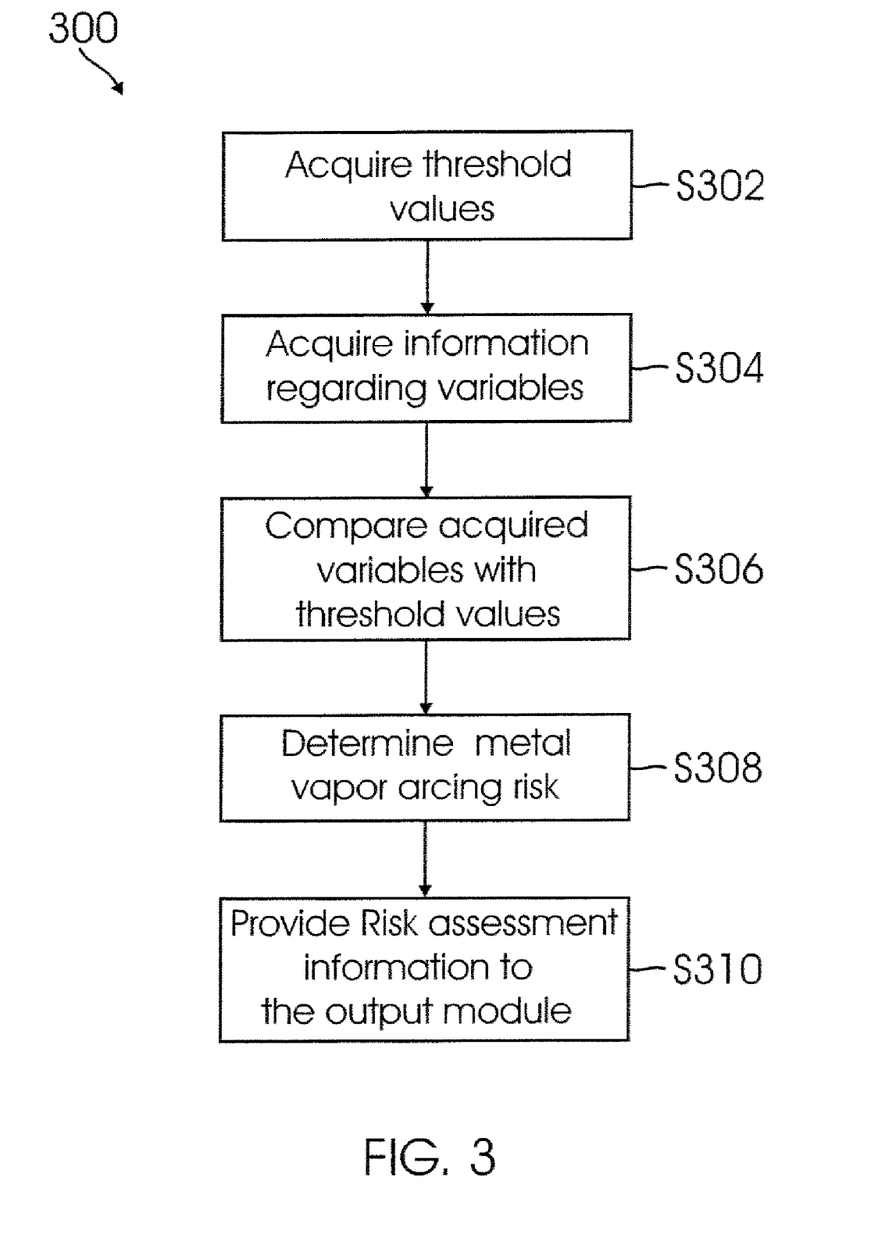
FIG. 3 is a flow diagram of an overall process for assessing metal vapor arcing risk for a LRU, according to an embodiment.

FIG. 3 is a flow diagram for an overall process 300 for assessing risk of metal vapor arcing in an LRU. Process begins in step S302, when threshold values are acquired. Input module 202 includes threshold data (or values) for various variables. Variables may include input pressure to an LRU, fuse-cut off current for the LRU, voltage potential, power supply and inductive voltage of the LRU and other similar variables. In one embodiment, an LRU that is being evaluated may also be identified as a critical component of system 100, or if it is placed adjacent to a critical component.

In step S304, current data for various variables of an LRU is acquired. In step S306, current variable values are compared with threshold data.

In step S308, based on the comparison, risk of metal vapor arcing is determined. In step S310 risk assessment results are provided to output module 210.

Figure 4A:
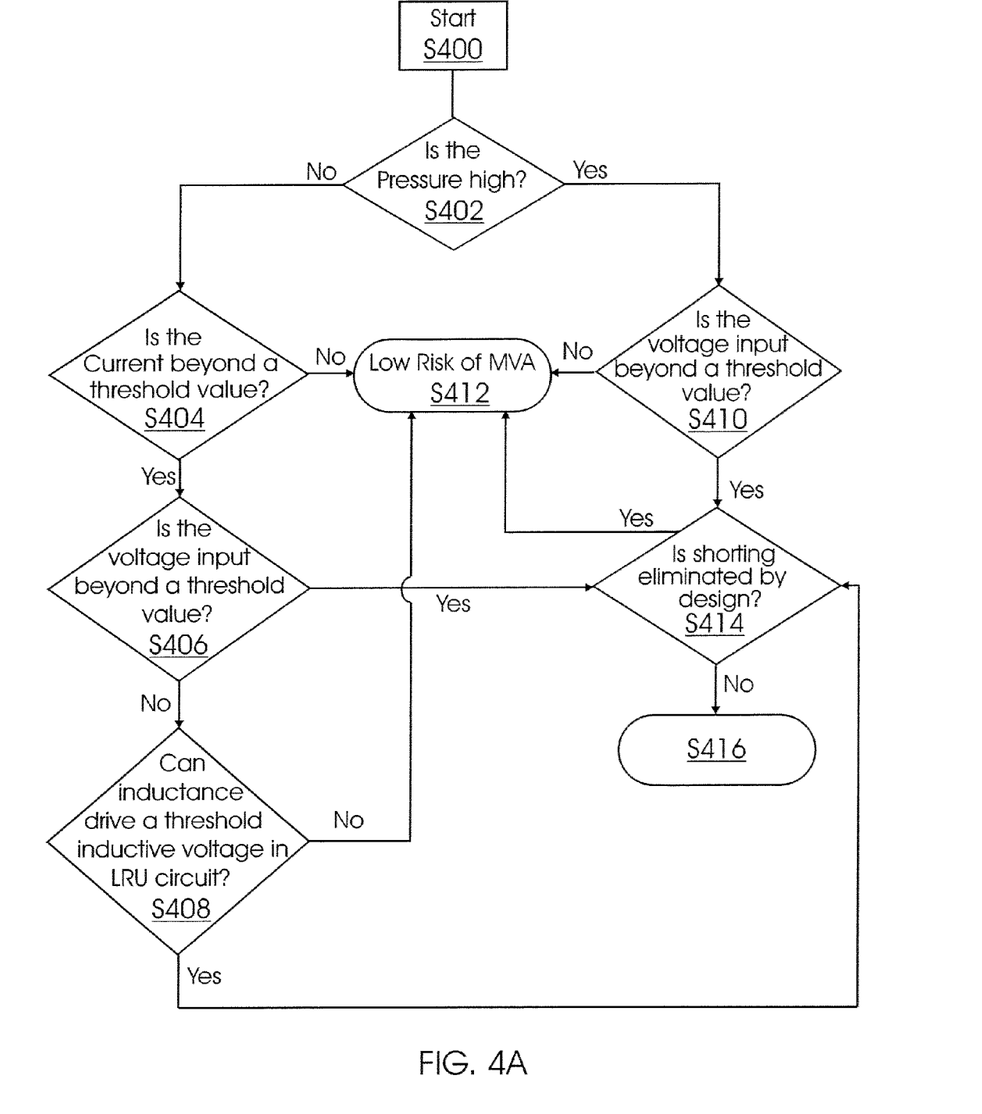
FIGS. 4A and 4B show detailed flow diagram for assessing metal vapor arcing risk, according to an embodiment.
Figure 4B:
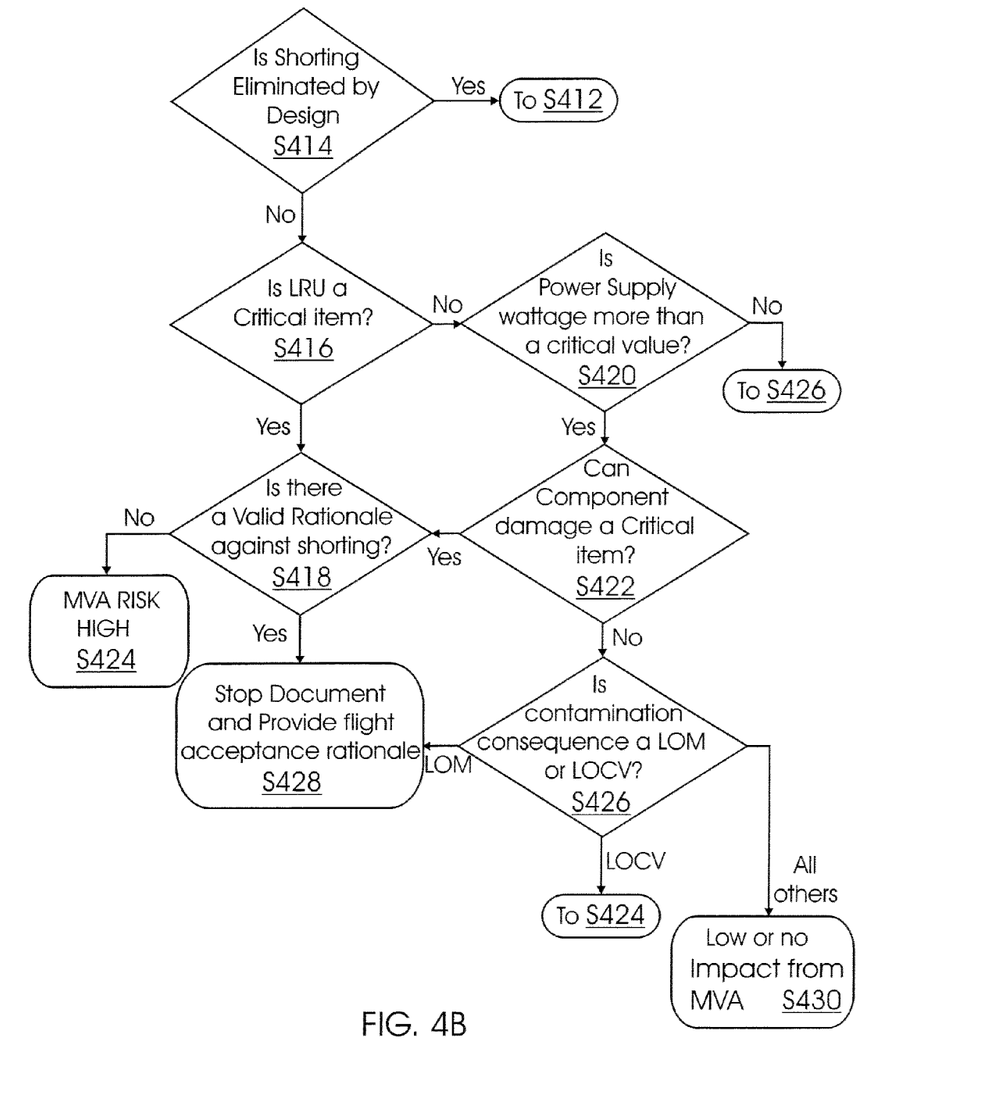

FIGS. 4A and 4B show a detailed flow diagram for assessing metal vapor arcing risk for an LRU. The process starts in step S400, when a LRU is selected. As an example, LRU 100A (FIG. 1A) is evaluated for metal vapor arcing risk.

In step S402, the operating pressure of LRU 100A is determined and compared to a threshold value to evaluate if the pressure is high or low. For example, a pressure of 8 psia or higher may be considered high pressure. LRU operating under pressure less than 8 psia may be considered as being under low pressure.

If LRU 100A is under low pressure, in step S404, it is determined if a fuse cutoff current for the LRU 100A is beyond a threshold value. For example, the threshold value may be 10 Amps.

If the fuse cutoff current is below the threshold value, then in step S412 it is inferred that the LRU has low metal vapor arcing risk. LRU 100A at this stage has low pressure conditions and the fuse cut-off current value is below a threshold value. Under these conditions it is difficult for solid metal to convert into vaporized metal ions, thereby reducing metal vapor arcing risk. Output module 210 is updated with information of assessed LRU 100A.

If the fuse cutoff current is beyond a threshold value, then the LRU's (100A) input voltage is compared to a threshold value in step S406. For example, the threshold value for input voltage may be 13V. If input voltage is lower then the threshold value, then in step S408, it is determined if LRU inductance is sufficient to drive a threshold inductive voltage in LRU circuit. For example, inductive threshold voltage may be 75V and an inductance of 10 mH may provide an inductive voltage of 75V or more.

High inductive voltage increases risk of metal vapor arcing. For example, inductive voltage of 25V poses minimum risk for metal vapor arcing while inductive voltage of 75V or more act as threshold voltage beyond which metal vapor arcing risk is high.

If LRU inductance is not sufficient to drive threshold inductive voltage in LRU circuit (in step S408), it is inferred that LRU 100A has low metal vapor arcing risk in step S412 and output module 210 is updated. If LRU inductance is high enough to drive threshold inductive voltage in LRU circuit, then the process moves to step S414, as described below.

If input voltage is higher than the threshold value in step S406, then in step S414 the LRU's (100A) structure is evaluated to determine if the LRU 100A is designed with minimal risk of shorting due to MVA. For example, design features may include presence of circuit breakers, opaque non-conductive materials placed on an LRU circuit forming a non-conductive barrier or other barriers to reduce risk associated with MVA.

If the LRU's 100A design and structure have features for reducing risk associated with MVA, then the LRU is labeled as having low metal vapor arcing risk and output module 210 is updated accordingly, in step S412.

In step S402 if LRU has high pressure, then in step S410, input voltage is compared to a threshold value. For example, the threshold value may be 130V. If input voltage is lower than a threshold value, then LRU 100A is labeled as low risk for metal vapor arcing in step S412. If input voltage is higher than the threshold value, the LRU 100A is evaluated to see if shorting is eliminated by design in step S414, as described above. It is noteworthy that the threshold value for input voltage in step S410 and S406 may vary.

In step S414, if upon design evaluation it is inferred that the LRU does not have features for reducing MVA risk, then it is determined if the LRU is a critical item in step S416. If LRU 100A is a critical item, in step S418, the LRU design is re-evaluated to determine if there is a valid rationale against shorting. LRU 100A is re-evaluated to analyze if structural or operational aspects of LRU have features reducing risks connected with MVA.

If there are no such design features, then in step S424, the LRU is labeled as having high risk for metal vapor arcing with potentially catastrophic consequences and output module 210 is updated accordingly.

If LRU 100A is not a critical item in step S416, then power supply wattage for the LRU 100A is checked in step S420. In Step S420, the power supply wattage is compared to a threshold value. The threshold power supply wattage may vary for different LRUs operating in low pressure and high pressure. For example, power supply wattage for a LRU operating under low pressure or vacuum is 300 W, and 1000 W for a LRU operating at higher pressure.

If the power supply wattage is higher than the threshold value, it may increase the MVA risk. In step S422, it is determined if the LRU 100A is adjacent to a critical component, shares a component with a critical LRU, or if the LRU 100A is a part of a critical component. If the LRU 100A is adjacent to a critical component, shares a component with a critical LRU, or part of critical component, then in step S418, the LRU is reevaluated to see there is any valid rationale against shorting. If there is a valid rationale against shorting, in step S428, the valid rationale is documented.

In Step S422, if it is determined that the LRU 100A is not adjacent to a critical component, or shares a component with a critical LRU, or if the LRU 100A is a part of a critical component the process moves to Step S426. In step S420, if the power supply wattage is below the threshold value then in step S426, it is determined if damage to the LRU would result in loss of miss on (LOM) or loss of crew and vehicle (LOCV) or metal vapor arcing would have only minor impact on the overall system. If LOM is expected, the process moves to step S428, the valid rationale is documented and output module 210 is updated.

If LOCV is expected, then in step S424, the LRU is categorized as having risk of metal vapor arcing with potentially catastrophic consequences. Output module 210 is updated with status.

If neither LOM nor LOCV (shown as "all others") is expected LRU 100A is labeled as having low or minor impact from metal vapor arcing in Step S430.

According to the present disclosure, a method and system for assessing risk of metal vapor arcing to a LRU component is provided. Although the foregoing examples are based on spacecraft systems, it is within the scope of the present disclosure to use this method for any system having components at risk of metal vapor arcing.

Although the present disclosure has been described with reference to specific embodiments, these embodiments are illustrative only and not limiting. Many other applications and embodiments of the present disclosure will be apparent in light of this disclosure and the following claims.

What is claimed is:

1. A computer-implemented method for assessing metal vapor arcing risk for a component, comprising:
    acquiring a current variable value associated with an operation of the component;
    comparing the current variable value with threshold value for the variable;
    evaluating compared variable data to determine the metal vapor arcing risk in the component; and
    generating a risk assessment status for the component, wherein the risk assessment status is used to accept or reject use of the component in a system.

2. The computer-implemented method of claim 1, wherein the variable includes fuse-cutoff current, pressure conditions, power wattage and voltage potential of the component.

3. The computer-implemented method of claim 1, wherein determining metal vapor arcing risk includes monitoring structural and operational features of the component to evaluate if metal vapor arcing is eliminated by design of the component.

4. A computer-implemented method for assessing metal vapor arcing risk for a component comprising:
- determining if the component is under high operating pressure or low operating pressure;
- determining if a fuse-cutoff current is beyond a threshold value for the component, if the component is under low pressure; and
- labeling the component as being at low risk for metal vapor arcing, if the fuse-cut off current is below the threshold value, wherein the labeled low risk component is accepted for use in a system.

5. The computer-implemented method of claim 4, further comprising:
- determining if the voltage input for the component is beyond a threshold value, if the fuse-cut off current is beyond a threshold value;
- determining if a component inductance can drive a threshold inductive voltage into component circuit, if the voltage input is below a threshold value; and
- labeling the component as being at low risk for metal vapor arcing, if the component lacks inductance to drive a threshold inductive voltage into the component circuit.

6. The computer-implemented method of claim 5, further comprising:
- determining if the component has structural or operational features eliminating shorting, if the component has inductance to drive a high voltage into the component circuit; and
- labeling the component as being at low risk for metal vapor arcing, if the component has structural or operational features eliminating shorting.

7. The computer-implemented method of claim 6, further comprising:
- determining if the component is a critical item, if the component does not have structural or operational features for eliminating shorting;
- re-evaluating the structural or operational features of the component to evaluate if there is a rationale against shorting, if the component is a critical item;
- documenting the rationale, if the component has valid rationale against shorting and
- labeling the component as being at high risk for meta vapor arcing, if there is no rationale against shorting.

8. The computer-implemented method of claim 7, further comprising:
- determining if a power supply wattage is beyond a critical value, if the component is not a critical item;
- determining if the component is adjacent to a critical item or part of a critical item, if the power supply wattage is more than a critical value;
- re-evaluating the structural or operational features of the component to assess if there is a valid rationale against shorting; and
- documenting the rationale, if the component has valid rationale against shorting or labeling the component as being at high risk for metal vapor arcing, if there is no valid rationale against shorting.

9. A computer program product, comprising a computer usable medium having a computer readable instructions embodied therein, said computer readable instructions when executed implements a method for generating a report assessing metal vapor arcing risk for a component, said method comprising:
- acquiring a current variable value associated with an operation of the component;
- comparing the current variable value with a threshold value for the variable;
- evaluating compared variable data to determine the metal vapor arcing risk in the component; and
- generating a risk assessment status for the component, wherein the risk assessment status is used to accept or reject use of the component in a system.

10. The computer program product of claim 9, wherein an assessment module executed by a processor acquires a current variable value, where the variable includes fuse-cutoff current, pressure conditions, power wattage and voltage potential of the component.

11. The computer program product of claim 9, wherein an input module executed by a processor provides threshold value for the variable.

12. The computer program product of claim 9, wherein a compare module executed by a processor compares the current variable value with the threshold value.

13. The computer program product of claim 9, wherein an assessment module executed by a processor evaluates compared variable data to determine the metal vapor arcing risk, where determining metal vapor arcing risk includes monitoring structural and operational features of the component to evaluate if metal vapor arcing is eliminated by design of the component.

14. A computer program product, comprising a computer usable medium having a computer readable instructions embodied therein, said computer readable instructions when executed implements a method for generating a metal vapor arcing risk assessment status for a component, said method comprising:
- determining if the component is under high operating pressure or low operating pressure;
- determining if a fuse-cutoff current is beyond a threshold value for the component, if the component is under low pressure; and
- labeling the component as being at low risk for metal vapor arcing, if the fuse-cut off current is below the threshold value, wherein the risk assessment status is used to accept or reject use of the component in a system.

15. The computer program product of claim 14 further comprising:
- determining if the voltage input for the component is beyond a threshold value, if the fuse-cut off current is beyond a threshold value;
- determining if a component inductance can drive a threshold inductive voltage into component circuit, if the voltage input is below a threshold value; and
- labeling the component as being at low risk for metal vapor arcing, if the component lacks inductance to drive a threshold inductive voltage into the component circuit, wherein the risk assessment status is used to accept or reject use of the component in a system.

16. The computer program product of claim 14, further comprising:
- determining if the component has structural or operational features eliminating shorting, if the component has inductance to drive a high voltage into the component circuit; and
- labeling the component as being at low risk for metal vapor arcing, if the component has structural or operational features eliminating shorting.

17. The computer program product of claim 14, further comprising:
- determining if the component is a critical item, if the component does not have structural or operational features for eliminating shorting;

re-evaluating the structural or operational features of the component to evaluate if there is a rationale against shorting, if the component is a critical item;

documenting the rationale, if the component has valid rationale against shorting; and labeling the component as being at high risk for metal vapor arcing, if there is no rationale against shorting.

18. The computer program product of claim 14, further comprising:

determining if a power supply wattage is beyond a critical value, if the component is a critical item;

determining if the component is adjacent to a critical item or part of a critical item, if the power supply wattage is more than a critical value;

re-evaluating the structural or operational features of the component to assess if there is a valid rationale against shorting; and documenting the rationale, if the component has valid rationale against shorting or labeling the component as being at high risk for metal vapor arcing, if there is no valid rationale against shorting.

19. The computer program product of claim 14, wherein an assessment module executed by a processor acquires current variable value, where the variable includes fuse-cutoff current, pressure conditions, power wattage and voltage potential of the component.

20. The computer program product of claim 14, wherein an input module executed by a processor provides threshold value for the variable.

21. The computer program product of claim 14, wherein a compare module executed by a processor compares the current variable value with the threshold value.

22. The computer program product of claim 14, wherein an assessment module executed by a processor evaluates compared variable data to determine the metal vapor arcing risk, where determining metal vapor arcing risk includes monitoring structural and operational features of the component to evaluate if metal vapor arcing is eliminated by design of the component.

* * * * *